US008581276B2

(12) United States Patent
Lee et al.

(10) Patent No.: US 8,581,276 B2
(45) Date of Patent: Nov. 12, 2013

(54) LIGHT EMITTING DEVICE AND METHOD OF MANUFACTURING THE SAME

(75) Inventors: Jae-won Lee, Suwon-si (KR); Su-hee Chae, Suwon-si (KR); Jun-youn Kim, Hwaseong-si (KR); Young-jo Tak, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 240 days.

(21) Appl. No.: 12/801,268

(22) Filed: Jun. 1, 2010

(65) Prior Publication Data

US 2011/0127489 A1    Jun. 2, 2011

(30) Foreign Application Priority Data

Dec. 2, 2009    (KR) .................... 10-2009-0118453

(51) Int. Cl.
*H01L 33/00*    (2010.01)

(52) U.S. Cl.
USPC .............................................. 257/94; 257/98

(58) Field of Classification Search
USPC .............................................. 438/47; 257/94
See application file for complete search history.

(56) References Cited

U.S. PATENT DOCUMENTS

| | | | |
|---|---|---|---|
| 7,233,028 B2 * | 6/2007 | Weeks et al. | 257/98 |
| 2003/0116774 A1 * | 6/2003 | Yamamoto et al. | 257/94 |
| 2005/0134526 A1 | 6/2005 | Willem et al. | |
| 2009/0101926 A1 | 4/2009 | Lee | |

FOREIGN PATENT DOCUMENTS

| | | |
|---|---|---|
| JP | 2002-135064 | 5/2002 |
| JP | 2003-332618 | 11/2003 |
| JP | 2008-066590 | 3/2008 |
| KR | 2005-0065355 | 6/2005 |
| KR | 10-2007-0096438 | 10/2007 |
| KR | 10-2008-0076308 | 8/2008 |
| KR | 10-2009-0017200 | 2/2009 |
| KR | 2009-0039089 | 4/2009 |

OTHER PUBLICATIONS

D. Zhu, et al., "*GaN-based LEDs grown on 6-inch diameter Si (111) substrates by MOVPE*," Proc. of SPIE, vol. 7231, pp. 1-11 (2009).
A. Dadgar, et al., "*Growth of blue GaN LED structures on 150-mm Si(111)*,"Journal of Crystal Growth, vol. 297, pp. 279-282 (2006).
A. Reiher, et al., "*Efficient stress relief in GaN heteroepitaxy on Si(111) using low-temperature AlN interlayers*,"Journal of Crystal Growth, vol. 248, pp. 563-567 (2003).
Jun-Seok Ha, et al., "*Reduction of dislocations in GaN films on AlN/sapphire templates using CrN nanoislands*," Applied Physics Letters, vol. 92, pp. 1-3 (2008).

(Continued)

*Primary Examiner* — Fernando L Toledo
*Assistant Examiner* — Valerie N Newton
(74) *Attorney, Agent, or Firm* — Harness, Dickey & Pierce, P.L.C.

(57) ABSTRACT

Example embodiments relate to a light emitting device and a method of fabricating the light emitting device. The light emitting device may include an n-type clad layer including a plurality of nitride semiconductor layers, at least one interlayer disposed between the plurality of nitride semiconductor layers, a via hole in which a first electrode is formed, a p-type clad layer, and an active layer between the n-type clad layer and the p-type clad layer.

23 Claims, 3 Drawing Sheets

(56) References Cited

OTHER PUBLICATIONS

Y. Fu, et al., "*Dislocation reduction in GaN grown on porous TiN networks by metal-organic vapor-phase epitaxy*," Journal of Applied Physics, vol. 99, pp. 1-7 (2006).

A. Dadgar, et al., "*Epitaxy of GaN LEDs on large substrates: Si or Sapphire?*,"Proc. of SPIE, vol. 6355, pp. 1-8 (2006).

K. Cheng, et al., "*Flat GaN Epitaxial Layers Grown on Si(111) by Metalorganic Vapor Phase Epitaxy Using Step-Graded AlGaN Intermediate Layers*,"Journal of Electronic Materials, vol. 35, No. 4, pp. 592-598 (2006).

K. Cheng, et al., "*High quality GaN grown on silicon(111) using a $Si_xN_y$ interlayer by metal-organic vapor phase epitaxy*,"Applied Physics Letters, vol. 92, pp. 1-3 (2008).

\* cited by examiner

LIGHT EMITTING DEVICE AND METHOD OF MANUFACTURING THE SAME

CROSS-REFERENCE TO RELATED APPLICATION

This application claims priority under 35 U.S.C. §119 to Korean Patent Application No. 10-2009-0118453, filed on Dec. 2, 2009 with the Korean Intellectual Property Office, the disclosure of which is incorporated herein in its entirety by reference.

BACKGROUND

1. Field

The present disclosure relates to light emitting devices having an electrode structure for reducing series resistance and operating voltage, and methods of fabricating the light emitting devices.

2. Description of the Related Art

Semiconductor light emitting devices emit light by using the recombination of minority carriers that are injected through a p-n junction structure of a semiconductor. The semiconductor light emitting devices may be classified as light emitting diodes (LEDs) and laser diodes. The LEDs are considered efficient and environmentally friendly light sources because of their relatively high brightness and relatively low power consumption. The LEDs are used in various fields, including displays, optical communications, automobiles, and general lighting.

Light emitting performance is an important factor in regard to light emitting devices, and calculating light emitting efficiency is one way to determine the light emitting performance of light emitting devices. The light emitting efficiency may be determined by internal quantum efficiency, extraction efficiency, and operation voltage. The internal quantum efficiency is a characteristic representing how many photons are generated with respect to electrons transmitting through the light emitting device and may be determined by the quality of a semiconductor material and the design of an activation area. The extraction efficiency denotes a ratio of the generated photons with respect to the amount of photons extracted from a semiconductor chip. The photons may be absorbed into the semiconductor chip again while being internally reflected a plurality of times due to a difference between refractive indexes of the semiconductor material and peripheral material. Therefore, the extraction efficiency is limited by the photons that are lost during the multiple-reflection and absorption in the semiconductor chip. The operation efficiency is determined by an energy band gap in the activation area and an electric resistance of the light emitting device.

SUMMARY

Example embodiments relate to light emitting devices having improved light emitting efficiency by reducing series resistance and operation voltage. Example embodiments also relate to methods of fabricating a light emitting device having improved light emitting efficiency.

A light emitting device according to example embodiments may include an n-type clad layer including a plurality of nitride semiconductor layers, at least one interlayer between the plurality of nitride semiconductor layers, and a via hole; a p-type clad layer on the n-type clad layer; an active layer between the n-type clad layer and the p-type clad layer; a first electrode in the via hole of the n-type clad layer; and a second electrode on the p-type clad layer.

The first electrode may contact at least one of the plurality of nitride semiconductor layers. The first electrode may also contact the closest one of the plurality of nitride semiconductor layer to the active layer. The closest one of the plurality of nitride semiconductor layers to the active layer may be doped with an n-type dopant, and the other nitride semiconductor layers may not be doped.

The light emitting device may further include a buffer layer on a bottom surface of the n-type clad layer. The buffer layer may include a textured lower surface. The light emitting device may further include a dielectric layer on an end portion of the first electrode. The n-type clad layer may be formed from a silicon substrate that is subsequently removed.

A method of fabricating a light emitting device may include forming a first nitride semiconductor layer on a silicon substrate; forming at least one pair of a first interlayer and a second nitride semiconductor layer on the first nitride semiconductor layer, the first nitride semiconductor layer and the at least one pair of the first interlayer and second nitride semiconductor layer constituting an n-type clad layer; forming an active layer on the n-type clad layer; forming a p-type clad layer on the active layer; removing the silicon substrate; etching a lower surface of the n-type clad layer to form a via hole; and injecting an electrode material into the via hole to form a first electrode.

BRIEF DESCRIPTION OF THE DRAWINGS

The above and/or other aspects of example embodiments may become more apparent and readily appreciated when the following description is taken in conjunction with the accompanying drawings of which.

DETAILED DESCRIPTION

Figure 1:
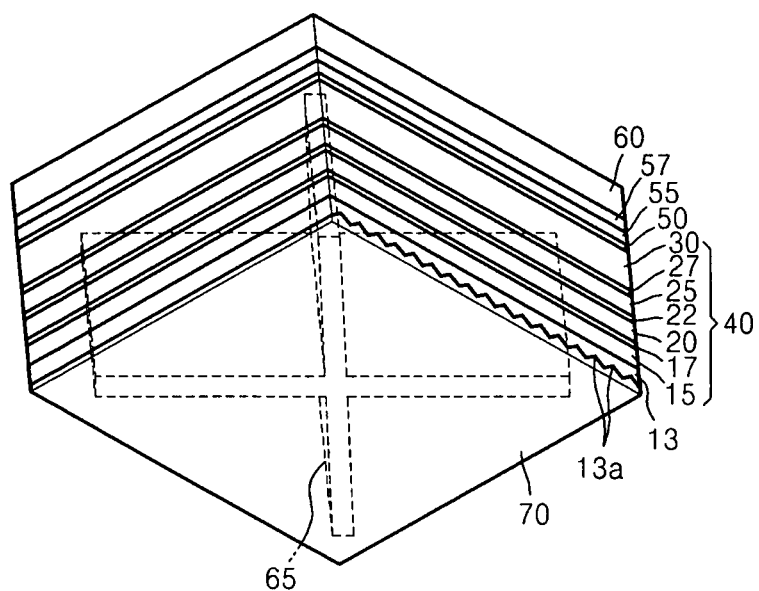
FIG. 1 is a perspective view of a light emitting device according to example embodiments.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view of a light emitting device according to example embodiments. FIG. 1 shows the light emitting device in a chip unit. Referring to FIG. 1, the light emitting device may include an n-type clad layer 40, a p-type clad layer 55, and an active layer 50 disposed between the n-type clad layer 40 and the p-type clad layer 55. The n-type clad layer 40 may include a plurality of nitride semiconductor layers and at least one interlayer disposed between the plurality of nitride semiconductor layers. For example, the n-type clad layer 40 may include a first nitride semiconductor layer 15, a first interlayer 17, a second nitride semiconductor layer 20, a second interlayer 22, a third nitride semiconductor layer 25, a third interlayer 27, and a fourth nitride semiconductor layer 30. The number of nitride semiconductor layers and the number of interlayers may vary depending on the thickness of the n-type clad layer 40 and are not limited to the example shown in FIG. 1. The nitride semiconductor layers may include a group III-V nitride semiconductor material, for example, gallium nitride (GaN).

An interlayer may be disposed between the nitride semiconductor layers to reduce the tensile stress generated in the nitride semiconductor layers when the n-type clad layer 40 is grown on a substrate and cooled, so as to increase a crack-free thickness of the clad layer or to reduce dislocation density generation due to a lattice mismatch. For example, when a nitride semiconductor layer is grown on a silicon (Si) substrate, tensile stress may be generated in the nitride semiconductor layer during the cooling of the nitride semiconductor layer due to a difference between thermal expansion coefficients of the substrate and the nitride semiconductor layer. In addition, when the tensile stress exceeds a critical value, cracks may form. For example, a crack-free critical thickness of a GaN layer grown on a Si substrate may be about 1 μm. However, the n-type clad layer 40 may need to be formed to a thickness of about 5 μm or greater in order to fabricate a higher quality n-type clad layer. Therefore, to increase the crack-free thickness of the n-type clad layer 40, the interlayer may be deposited to a thickness of about a few to hundreds of nanometers while growing the nitride semiconductor layer to relieve the tensile stress.

The interlayer may be formed of at least one material selected from the group consisting of AlN, $Al_xGa_{1-x}N$, and $SiN_x$. The material may be deposited at a relatively low or high temperature. In addition, the interlayer may include superlattices. When the interlayer is formed of $Al_xGa_{1-x}N$, the interlayer may be doped with Si so as to be deposited as an n-type semiconductor layer in order to reduce resistance. The interlayer may have a thickness of about 1 nm to about 100 nm, and the nitride semiconductor layer may have a thickness of about 300 nm to about 2 μM. The material and thickness of each of the interlayers as well as the material and thickness of each of the nitride semiconductor layers need not be the same. For instance, the nitride semiconductor layer closest to the active layer may be thicker than the other nitride semiconductor layers.

The active layer 50 may emit light by using the recombination of electrons-holes and may be formed of a nitride semiconductor layer based on InGaN. A wavelength of the emitted light may be adjusted by controlling an energy band gap. The active layer 50 may include a quantum well layer and a barrier layer. For example, the active layer 50 may include a quantum well layer and barrier layer formed of InGaN/GaN, InGaN/InGaN, InGaN/AlGaN, or InGaN/InAlGaN. The quantum well layer may be a single quantum well or a multi-quantum well.

The p-type clad layer 55 may be formed of a group III-V nitride semiconductor material. For example, the p-type clad layer 55 may be a p-type GaN layer. Mg, Ca, Zn, Cd, or Hg may be used as a p-type dopant.

The completed light emitting device according to example embodiments may not include a substrate. For example, although a substrate (e.g., Si substrate) may be used during manufacturing, wherein the n-type clad layer 40, the active layer 50, and the p-type clad layer 55 may be grown on the Si substrate, the Si substrate may be subsequently removed prior to completion of the light emitting device. The removal of the substrate will be described later.

The n-type clad layer 40 may include at least one via hole 65, and a first electrode 70 may be formed in the via hole 65. The via hole 65 may be patterned on a lower surface of the n-type clad layer 40 and etched so as to extend into the n-type clad layer 40. An electrode material may be injected into the via hole 65 to form the first electrode 70. The first electrode 70 may contact at least one of the nitride semiconductor layers in the n-type clad layer 40. Furthermore, the first electrode 70 may be formed on the nitride semiconductor layer that is closest to the active layer 50 relative to the other nitride semiconductor layers in the n-type clad layer 40. For example, an inner end of the first electrode 70 may contact the nitride semiconductor layer (e.g., fourth nitride semiconductor layer 30) that is closest to the active layer 50. When the first electrode 70 reaches the nitride semiconductor layer that is closest to the active layer 50, the loss of electrons (which are injected through the first electrode 70 and that pass through the barriers of the interlayer having a relatively low electric conductivity) may be reduced. As a result, the electrons may move with relative ease to the active layer 50 through the first electrode 70 with lower resistance. Therefore, the light emitting efficiency may be improved.

All the nitride semiconductor layers in the n-type clad layer 40 may be doped with an n-type dopant. Alternatively, only some of the nitride semiconductor layers in the n-type clad layer 40 may be doped with an n-type dopant. For example, the nitride semiconductor layer (e.g., fourth nitride semiconductor layer 30) that is closest to the active layer 50 may be doped with an n-type dopant, and the other nitride semiconductor layers may not be doped. Because the n-type dopant may contribute to crack formation during the cooling operation, the nitride semiconductor layer that is closest to the active layer 50 may be doped with an n-type dopant, while the other nitride semiconductor layers are not doped so as to increase the crack-free thickness of the n-type clad layer 40.

The first electrode 70 may include at least one element selected from the group consisting of Au, Cu, Ni, Ag, Cr, W, Al, Pt, Sn, Pb, Fe, Ti, and Mo. The first electrode 70 may also include at least one material selected from the group consisting of indium tin oxide (ITO), ZrB, ZnO, InO, and SnO.

A reflective layer 57 and a support layer 60 may be formed on the p-type clad layer 55. The reflective layer 57 and the support layer 60 may operate as a second electrode. Therefore, when the reflective layer 57 and the support layer 60 are used as the second electrode, an additional second electrode may not be formed. The reflective layer 57 may be formed of a metal material having relatively high electrical conductivity and reflectivity. The support layer 60 may be formed of a silicon-based material or a metal material having relatively high electrical conductivity and thermal conductivity. The first electrode 70 and the second electrode may be connected to an external power supply unit through a wire bonding operation so that electrons and holes may be injected into the active layer 50.

A buffer layer 13 may be formed under the n-type clad layer 40. The buffer layer 13 may be formed to compensate for the tensile stress that may be generated during the cooling operation after growing the n-type clad layer 40 on the substrate (10 of FIG. 3A). The buffer layer 13 may be formed of a material having a lattice constant that is smaller than that of the nitride semiconductor layers so that compressive stress may be accumulated when growing the nitride semiconductor layers. For example, the buffer layer 13 may be formed of aluminum nitride (AlN) or $Al_xGa_{1-x}N$ (0≤x<1). The buffer layer 13 may be formed while adjusting a composition ratio of $Al_xGa_{1-x}N$ in a graded or a step-wise manner in order to reduce lattice defects through the gradual adjustment of the lattice constant. In addition, the buffer layer 13 may be formed to have $Al_xGa_{1-x}N/Al_yGa_{1-y}N$ (0≤x, y≤1, x≠y) superlattices. The buffer layer 13 may include a texture 13a on a lower surface thereof.

Alternatively, the buffer layer 13 may be removed from the substrate after depositing the layers on the substrate. When the buffer layer 13 is completely removed, the n-type clad layer 40 may include a texture on a lower surface thereof.

Figure 2:
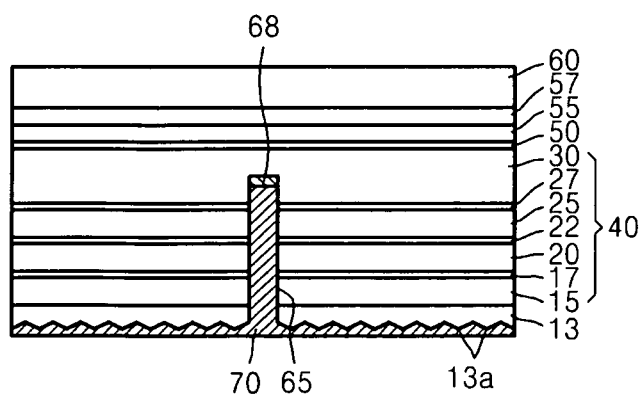
FIG. 2 is a cross-sectional view of another light emitting device according to example embodiments.

FIG. 2 is a cross-sectional view of another light emitting device according to example embodiments. FIG. 2 shows the light emitting device of FIG. 1 further including a dielectric layer 68 (among other differences). Referring to FIG. 2, the dielectric layer 68 may be provided on the end portion of the first electrode 70. The dielectric layer 68 may be formed of, for example, $SiO_2$ or a resin. The dielectric layer 68 may be formed to increase current spreading through the first electrode 70. Because the current flowing through the first electrode 70 may be interrupted by the dielectric layer 68, the current may be spread in a horizontal direction at the portion where the nitride semiconductor layer (e.g., fourth nitride semiconductor layer 30) and the first electrode 70 contact each other. Thus, the current may be evenly spread throughout the nitride semiconductor layer.

Figure 3A:
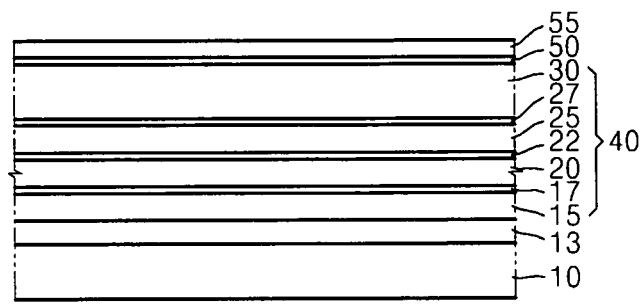
FIGS. 3A through 3D are cross-sectional views illustrating a method of fabricating a light emitting device according to example embodiments.

FIGS. 3A through 3D are cross-sectional views illustrating a method of fabricating a light emitting device according to example embodiments. FIGS. 3A through 3D show a light emitting device in a wafer unit. Referring to FIG. 3A, the buffer layer 13 may be formed on a substrate 10. The substrate 10 may be a sapphire substrate, a silicon carbide (SiC) substrate, a silicon substrate, or a GaN substrate. The silicon substrate may be a Si (111) substrate. After wet-cleaning the substrate 10 and treating the substrate 10 by using hydrogen fluoride (HF), the buffer layer 13, the n-type clad layer 40, the active layer 50, and the p-type active layer 55 may be formed (e.g., grown). The above layers may be grown by well-known growing methods, for example, by a metal organic chemical vapor deposition (MOCVD), a hydride vapor phase epitaxy (HVPE) method, a molecular beam epitaxy (MBE), or a halide chemical vapor deposition (HCVD) method.

The buffer layer 13 may be formed of a material having a smaller lattice constant than that of the nitride semiconductor layer, for example, AlN or $Al_xGa_{1-x}N$ (0≤x<1). The n-type clad layer 40 may be grown on the buffer layer 13. The n-type clad layer 40 may be formed by alternately growing the nitride semiconductor layer and the interlayer. In FIG. 3A, the first nitride semiconductor layer 15, the first interlayer 17, the second nitride semiconductor layer 20, the second interlayer 22, the third nitride semiconductor layer 25, the third interlayer 27, and the fourth nitride semiconductor layer 30 may be sequentially deposited. The number of nitride semiconductor layers and the number of interlayers in the n-type clad layer 40 may vary according to the thickness of the n-type clad layer 40. The interlayer may be formed of AlN, $Al_xGa_{1-x}N$, or $SiN_x$ and may be deposited at a relatively low or high temperature. For example, when the interlayer is formed of $Al_xGa_{1-x}N$, the interlayer may be n-doped with Si to reduce the resistance. The interlayer may be formed of a combination of various materials and may be formed to have a superlattice structure. Each of the interlayers may be formed to a thickness of about 1 nm to about 100 nm, and each of the nitride semiconductor layers may be formed to a thickness of about 300 nm to about 2 μm. The interlayers may not be formed of the same material. In addition, the thicknesses of the interlayers and the nitride semiconductor layers do not need to be equal. For example, the nitride semiconductor layer (e.g., fourth nitride semiconductor layer 30) that is closest to the active layer 50 may be thicker than the other nitride semiconductor layers.

All of the nitride semiconductor layers in the n-type clad layer 40 may be doped with an n-type dopant. Alternatively, only some of the nitride semiconductor layers in the n-type clad layer 40 may be doped with an n-type dopant. For example, the nitride semiconductor layer (e.g., fourth nitride semiconductor layer 30) that is closest to the active layer 50 may be doped with an n-type dopant, and the other nitride semiconductor layers may not be doped. Because cracks may form during the cooling operation due to the tensile stress when the nitride semiconductor layer is doped with a silicon dopant, the crack-free thickness of the n-type clad layer 40 may be increased when the nitride semiconductor layers are not doped with the n-type dopant. In a conventional vertical-type light emitting device, all of the nitride semiconductor layers are doped with an n-type dopant. However, it is not necessary to dope all the nitride semiconductor layers with the n-type dopant in the light emitting device according to example embodiments, since the first electrode 70 may be disposed in the n-type clad layer 40 so as to be directly in contact with the doped fourth nitride semiconductor layer 30.

Figure 3B:
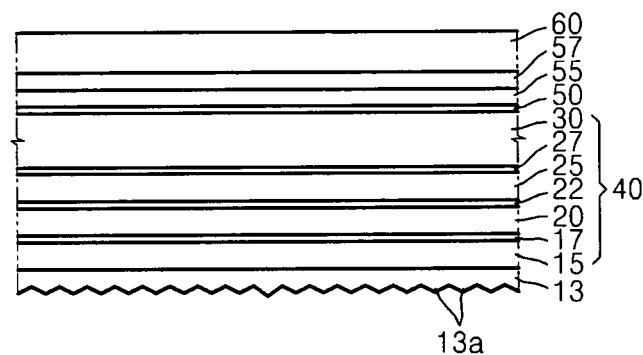

Referring to FIG. 3B, the reflective layer 57 may be attached to the p-type clad layer 55, and the support layer 60 may be bonded onto the reflective layer 57 in a wafer bonding method. When the reflective layer 57 is attached to the p-type clad layer 55, a material having relatively high adhesiveness and electric conductivity may be used. The reflective layer 57 may be formed of a material having relatively high electric conductivity and reflectivity, and the support layer 60 may be formed of silicon or metal having relatively high electric conductivity and thermal conductivity. The reflective layer 57 and the support layer 60 may be used as a second electrode.

The substrate 10 may be removed to prevent the light emitted from the active layer 50 of the light emitting device from being absorbed by the substrate 10 (e.g., silicon substrate). Because silicon has a band gap of about 1.12 eV, a silicon substrate may absorb the light of the visible and infrared wavelengths, thereby degrading the light emitting efficiency. The substrate 10 may be removed by a grinding, lapping, polishing, or wet/dry etching operation. With regard to a vertical-type light emitting device, a silicon substrate may be easier to fabricate, may give a higher yield, and may be more economically removed than a sapphire substrate where a laser lift off (LLO) process is typically applied. When the substrate 10 is removed, a part of or the entire buffer layer 13 may also be removed together with the substrate 10.

However, even when the buffer layer 13 is formed of a material having relatively low electrical conductivity, the buffer layer 13 may not be removed if the buffer layer 13 does not absorb the light emitted from the active layer 50. If an electrode is located under the buffer layer 13 and the current is lost due to the buffer layer 13 having a relatively low electric conductivity, then the buffer layer 13 may be removed. However, when the first electrode 70 is disposed in the n-type clad layer 40, the current does not flow mainly through the buffer layer 13. Thus, the buffer layer 13 may not be removed, and the processes may be simplified.

FIG. 3B shows that only some parts of the buffer layer 13 are removed. As a result of removing the substrate 10 and some parts of the buffer layer 13, a texture 13a may be formed on the surface of the buffer layer 13. The texture 13a may reduce or prevent the light emitted from the active layer 50 from being totally reflected by the buffer layer 13. Thus, the extraction efficiency and external quantum well may be improved. When the buffer layer 13 is completely removed, a textured lower surface may be formed on the first nitride semiconductor layer 15 of the n-type clad layer 40.

Figure 3C:
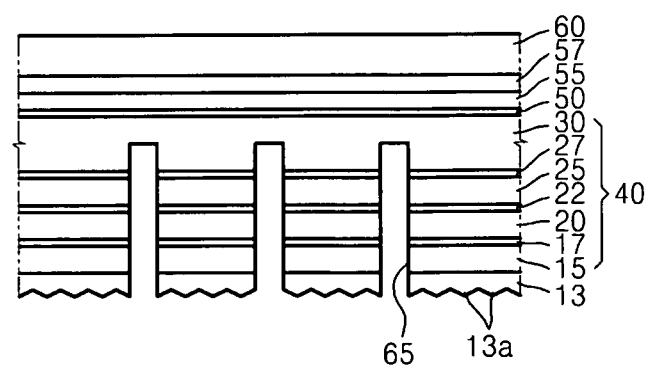

Referring to FIG. 3C, the buffer layer 13 may be etched using a mask to form a via hole 65. The via hole 65 may penetrate from the surface of the buffer layer 13 to a certain layer in the n-type clad layer 40. For example, the via hole 65 may be formed to reach the nitride semiconductor layer (e.g., fourth nitride semiconductor layer 30) that is closest to the active layer 50 in the n-type clad layer 40. When the via hole 65 is formed, $SiO_2$ or photoresist may be deposited on the buffer layer 13 as a mask, and the buffer layer 13 may be dry-etched to form the via hole 65. The via hole 65 may be formed to have a circular shape, a rectangular shape, an X-shape, a mesh shape, or a finger-like shape.

Figure 3D:
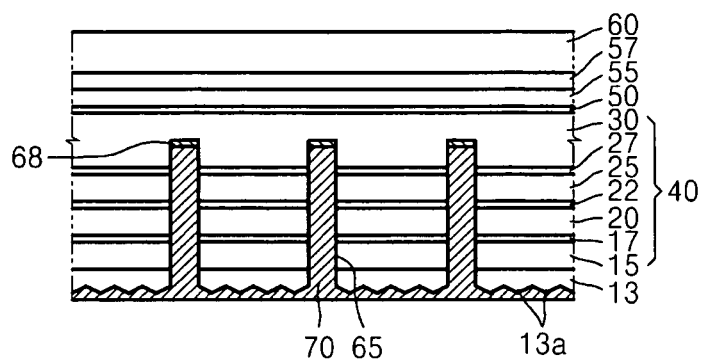

Referring to FIG. 3D, an electrode material may be injected into the via hole 65 to form the first electrode 70. The first electrode 70 may be formed by a plating method or a physical vapor deposition (PVD) method. The first electrode 70 may be formed of at least one material selected from the group consisting of Au, Cu, Ni, Ag, Cr, W, Al, Pt, Sn, Pb, Fe, Ti, Mo, and combinations thereof. Alternatively, the first electrode 70 may be formed of a transparent conducting oxide (TCO) material, for example, at least one material selected from the group consisting of ITO, ZnO, ZrB, ZnO, InO, and SnO.

The first electrode 70 may be formed as various shapes, for example, a circular shape, a rectangular shape, an X-shape, a mesh shape, or a finger-like shape according to the shape of the via hole 65. For example, if the first electrode 70 is formed to have the X-shape, a contact area between the first electrode 70 and the n-type clad layer 40 may be relatively large. Thus, current spreading may actively occur. Since the first electrode 70 is disposed in the n-type clad layer 40, the loss of electrons (which are injected through the first electrode 70) caused while transmitting through the barrier of the interlayer may be reduced. In addition, the electrons may move with relative ease through the first electrode 70 with relatively low resistance and may be combined with the holes injected through the second electrode to emit light from the active layer 50.

A dielectric layer 68 may also be further formed on the inner end portion of the via hole 65 before forming the first electrode 70. The dielectric layer 68 may be formed of $SiO_2$ or resin, and thus, may accelerate current spreading through the first electrode 70. The current flowing in the vertical direction through the first electrode 70 may be interrupted by the dielectric layer 68. Thus, the current may flow in the horizontal direction and spread evenly in the n-type clad layer 40.

The light emitting device according to example embodiments may include an electrode structure which reduces the series resistance and the operation voltage. As a result, the light emission efficiency may increase. In addition, because the light emitting device may be fabricated on a silicon substrate, fabrication costs may be reduced.

In the method of fabricating the light emitting device according to example embodiments, a silicon substrate may be used to fabricate a relatively large area substrate with lower costs, and the thickness of the clad layer may be increased by interposing the interlayer in the n-type clad layer. In addition, because the first electrode directly contacts at least one nitride semiconductor layer in the n-type clad layer, the loss of current due to the resistance may be reduced, and thus, the operation voltage may be reduced and the light emission efficiency may be improved.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A light emitting device comprising:
   an n-type clad layer including a plurality of nitride semiconductor layers, at least one interlayer between the plurality of nitride semiconductor layers, and a via hole, the at least one interlayer being thinner than the plurality of nitride semiconductor layers;
   a p-type clad layer on the n-type clad layer;
   an active layer between the n-type clad layer and the p-type clad layer;
   a first electrode in the via hole of the n-type clad layer; and a second electrode on the p-type clad layer,
wherein the first electrode extends through at least one of the plurality of nitride semiconductor layers and the at least one interlayer.

2. The light emitting device of claim 1, wherein the first electrode contacts at least one of the plurality of nitride semiconductor layers.

3. The light emitting device of claim 1, wherein the first electrode contacts the closest one of the plurality of nitride semiconductor layers to the active layer.

4. The light emitting layer of claim 1, wherein the closest one of the plurality of nitride semiconductor layers to the active layer is doped with an n-type dopant, and the other nitride semiconductor layers are not doped.

5. The light emitting device of claim 1, further comprising:
a buffer layer on a bottom surface of the n-type clad layer.

6. The light emitting device of claim 5, wherein the buffer layer includes a textured lower surface.

7. The light emitting device of claim 1, wherein the interlayer includes at least one material selected from the group consisting of AlN, $Al_xGa_{1-x}N$, and $SiN_X$.

8. The light emitting device of claim 1, wherein the interlayer includes a superlattice structure.

9. The light emitting device of claim 1, wherein the first electrode has a circular shape, a rectangular shape, a finger-like shape, or an X-shape.

10. The light emitting device of claim 1, further comprising:
a dielectric layer on an end portion of the first electrode.

11. The light emitting device of claim 1, wherein the n-type clad layer is formed from a silicon substrate that is subsequently removed.

12. The light emitting device of claim 1, wherein the second electrode includes a reflective layer and a support layer.

13. The light emitting device of claim 1, wherein the at least one interlayer is a nitride layer.

14. The light emitting device of claim 1, wherein the n-type clad layer includes at least two interlayers alternately arranged with the plurality of nitride semiconductor layers.

15. The light emitting device of claim 1, wherein the first electrode covers an entire underside of the light emitting device so as to form a planar, bottom surface.

16. A method of fabricating a light emitting device, comprising:
forming a first nitride semiconductor layer on a silicon substrate;
forming at least one pair of a first interlayer and a second nitride semiconductor layer on the first nitride semiconductor layer to attain an n-type clad layer;
forming an active layer on the n-type clad layer;
forming a p-type clad layer on the active layer;
removing the silicon substrate;
etching a lower surface of the n-type clad layer to form a via hole; and
injecting an electrode material into the via hole to form a first electrode.

17. The method of claim 16, wherein the etching includes dry-etching the n-type clad layer until the via hole reaches the second nitride semiconductor layer that is closest to the active layer.

18. The method of claim 17, further comprising:
injecting a dielectric material into the via hole to form a dielectric layer at an end portion of the via hole before injecting the electrode material.

19. The method of claim 18, wherein the dielectric layer includes $SiO_2$ or a resin.

20. The method of claim 16, further comprising:
forming a buffer layer on the silicon substrate prior to forming the first nitride semiconductor layer.

21. The method of claim 20, further comprising:
forming a textured lower surface for the buffer layer or the n-type clad layer after removing the silicon substrate and part or all of the buffer layer.

22. The method of claim 16, wherein forming the second nitride semiconductor layer includes doping the second nitride semiconductor layer that is closest to the active layer with an n-type dopant.

23. The method of claim 16, wherein the first electrode includes at least one element selected from the group consisting of Au, Cu, Ni, Ag, Cr, W, Al, Pt, Sn, Pb, Fe, Ti, and Mo, or at least one material selected from the group consisting of indium tin oxide (ITO), ZrB, ZnO, InO, and SnO.

* * * * *